United States Patent
Hauer

(10) Patent No.: US 11,747,374 B2
(45) Date of Patent: Sep. 5, 2023

(54) OVERCURRENT DETECTOR

(71) Applicant: Eaton Intelligent Power Limited, Dublin (IE)

(72) Inventor: Wolfgang Hauer, Vorderweissenbach (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/756,159

(22) PCT Filed: Nov. 18, 2020

(86) PCT No.: PCT/EP2020/082605
§ 371 (c)(1),
(2) Date: May 18, 2022

(87) PCT Pub. No.: WO2021/099429
PCT Pub. Date: May 27, 2021

(65) Prior Publication Data
US 2022/0413020 A1    Dec. 29, 2022

(30) Foreign Application Priority Data
Nov. 20, 2019 (GB) .................................. 1916916

(51) Int. Cl.
*G01R 19/165* (2006.01)
*H03K 17/082* (2006.01)

(52) U.S. Cl.
CPC ... *G01R 19/1659* (2013.01); *G01R 19/16576* (2013.01); *H03K 17/082* (2013.01)

(58) Field of Classification Search
CPC ............ H03K 5/08; H03K 5/082; H03K 5/22; H03K 5/24; H03K 17/082; H02H 3/08;
(Continued)

(56) References Cited

U.S. PATENT DOCUMENTS

| 2002/0158633 | A1* | 10/2002 | Baumgaertl | H02H 1/04 324/424 |
| 2011/0216448 | A1  | 9/2011  | Hisada et al. | |
| 2014/0240882 | A1* | 8/2014  | Hogg | H02J 7/0031 361/87 |

FOREIGN PATENT DOCUMENTS

| EP | 2961019 A1    | 12/2015 |
| JP | 2013085443 A  | 5/2013  |
| WO | 2018/109161 A1| 6/2018  |

* cited by examiner

*Primary Examiner* — Long Nguyen
(74) *Attorney, Agent, or Firm* — LEYDIG, VOIT & MAYER LTD.

(57) ABSTRACT

An overcurrent detector with an electric line and a sensor for monitoring an electric current in the line and outputting a measurement signal, and an integral-unit adapted to integrate an interval of consecutive values of the measurement signal and outputting an integrator-signal, the detector comprises a comparator unit for comparing a value of the integrator-signal with a threshold level and outputting a trigger signal, with the detector further comprises a threshold level determination unit, an input being connected to the sensor for receiving an actual measurement signal, and with an output being connected to the comparator unit, proving the comparator unit with the threshold level, and that the threshold level determination unit is adapted to determine the threshold level in dependence on the value of the actual measurement signal.

15 Claims, 1 Drawing Sheet

(58) Field of Classification Search
CPC ...... H02H 3/085; H02H 3/087; G01R 19/165; G01R 19/16566; G01R 19/16571; G01R 19/16576; G01R 19/1659
See application file for complete search history.

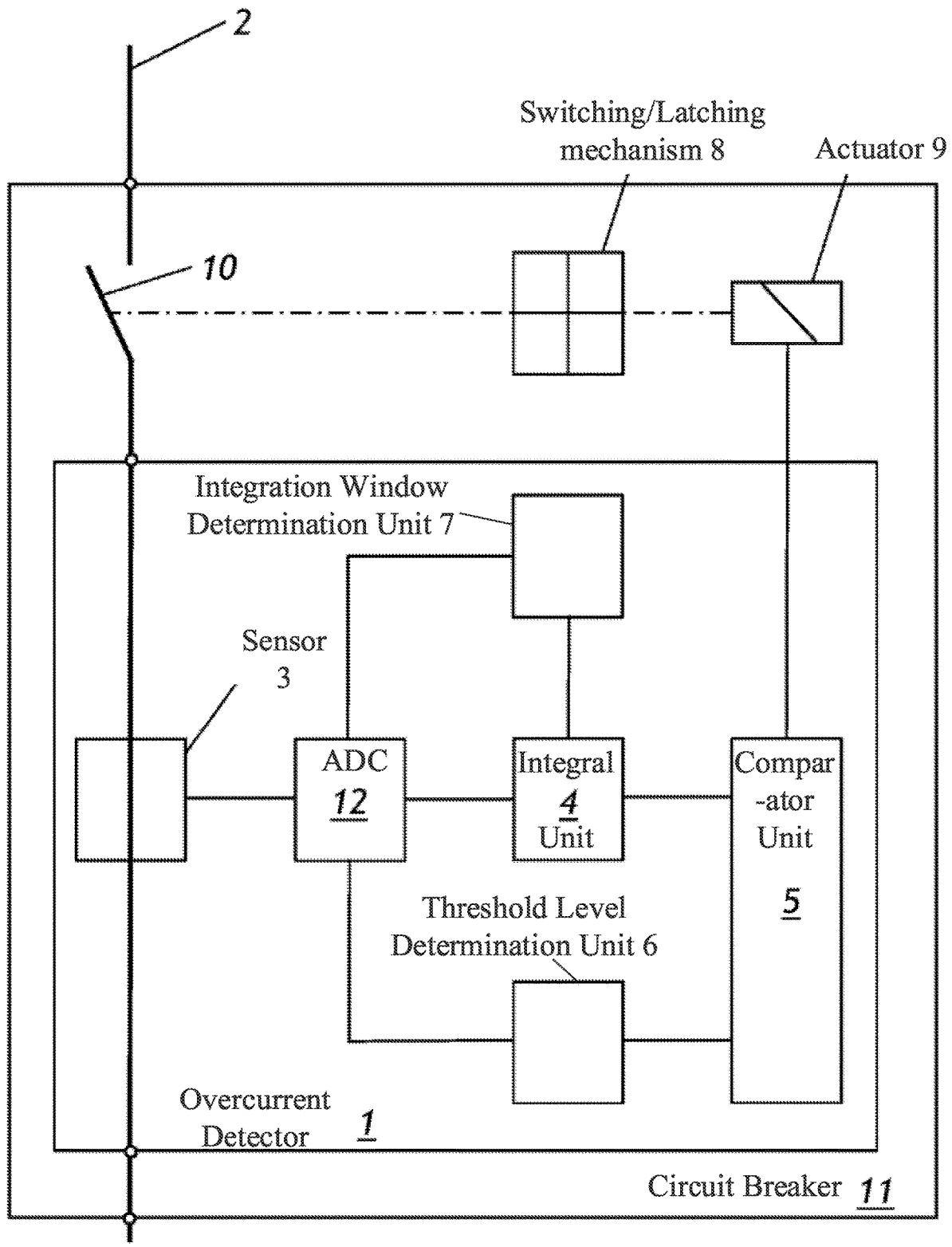

OVERCURRENT DETECTOR

The present disclosure relates to an overcurrent detector according to the generic part of claim 1.

Most of the fault detection algorithms presented in literature are based either on threshold check of the current or on a combined current and rate of current rise analysis and where specially designed for AC applications (with ohmic-inductive behavior). The disadvantage when using such fault detection algorithm is there tendency to cause nuisance tripping. Fast changes of the current signal due to spikes or capacitive inrush current may exceed the threshold or may cause a high signal of the derivation output. The result is an unwanted tripping in both cases.

There are also known overcurrent detection methods using the integration of currant samples. Such known circuits are more robust against nuisance tripping in case of transient currents, but they still tend to nuisance tripping in a lot of other cases, especially in special current pattern during normal operation.

It is an object of the present invention to overcome the drawbacks of the state of the art by providing an overcurrent detector which can has a low tendency to nuisance tripping and a high flexibility to be adapted to different, especially predefined selective, tripping requirements.

According to the invention, this object is solved by the features of claim 1.

As a result, the overcurrent detector has a low tendency to nuisance tripping and a high flexibility to be adapted to different, especially predefined selective, tripping requirements. It is also very robust in case of transient currents and can be easily adapted to react on further unusual current pattern. Further it is possible to embed the overcurrent detector with a reaction behaviour which is not limited to the reaction curve of a bimetal.

Dependent claims describe further preferred embodiments of the invention.

The invention is described with reference to the drawing. The drawing is showing only a preferred embodiment.

The single FIGURE shows a block diagram of a first preferred embodiment of an overcurrent detector according to the invention as part of an overcurrent protection switch.

The single FIGURE shows a preferred embodiment of an overcurrent detector 1 with at least one electric line 2 passing the detector 1 and at least one sensor 3 adapted for monitoring an electric current in the electric line 2 and outputting a current measurement signal, further comprising an integral-unit 4 adapted to integrate a predefined interval of consecutive values of the current measurement signal and outputting an integrator-signal, the detector 1 further comprising a comparator unit 5 adapted to compare a value of the integrator-signal with a threshold level, and outputting a trigger signal in case the value of the integrator-signal reaches the threshold level, with the detector 1 further comprises a threshold level determination unit 6, with an input of the threshold level determination unit 6 being connected to the sensor 3 for receiving an actual current measurement signal, and with an output of the threshold value determination unit 6 being connected to the comparator unit 5, proving the comparator unit 5 with the threshold level, and that the threshold level determination unit 6 is adapted to determine the threshold level in dependence on the value of the actual current measurement signal.

As a result, the overcurrent detector 1 has a low tendency to nuisance tripping and a high flexibility to be adapted to different, especially predefined selective, tripping requirements. It is also very robust in case of transient currents and can be easily adapted to react on further unusual current pattern. Further it is possible to embed the overcurrent detector with a reaction behaviour which is not limited to the reaction curve of a bimetal.

The actual overcurrent detector 1 combines the behavior of the time integral of the current with the actual current value. The actual current value influences the trigger value respective the trip criteria according which the long time behavior is judged. The behavior of the time integral of the current represents the behavior of the current over a longer time.

In the example described, the overcurrent detector 1 contains at least one electric line 2. Alternatively, the overcurrent detector 1 contains also a second electric line and can contain a number of further electric lines.

The overcurrent detector 1 can be a stand-alone component, comprising a casing and clamps for connecting the electric line 2.

The overcurrent detector 1 can also detect a short current as special kind of an overcurrent.

The overcurrent detector 1 is especial advantages for the detection of DC-overcurrents, but may also be implemented for AC applications.

In the example described and according the only FIGURE, the overcurrent detector 1 is an integral part of an overcurrent protective switching device or a circuit breaker 11. A trigger output of the overcurrent detector 1 is connected to an actuator 9 and/or a switching or latching mechanism 8 of the circuit breaker 11, and the switching mechanism 8 is connected to at least one pair of switching contacts 10 arranged in the electric line 2 and the further preferred additional electric lines. The circuit breaker 11 further comprises clamps.

Alternatively the circuit breaker 11 can be implemented as a hybrid circuit breaker or a solid state circuit breaker.

As indicated earlier, the overcurrent detector 1 comprises the first current sensor 3 which monitors the electric current in the electric line 2. Preferably, the overcurrent detector 1 comprises one current sensor 3 for each electric line 2.

The first sensor 3 can be of any type of current sensor 3. The current sensor 3 outputs a current measurement signal. Typically the sensor 3 outputs an analog current measurement signal. In this case, and as shown in the only FIGURE The output of the sensor 3 is preferably connected to an Analog to Digital Converter or ADC 12 to convert the current measurement signal into an integer value.

According the preferred embodiment the actual overcurrent detector 1 is implemented mostly digital. However it would also be possible to implement it analog.

The output of the current sensor 3 or of the ADC 12 is connected to an integral-unit 4. The integral-unit 4 is adapted to integrate a predefined interval of consecutive values of the current measurement signal and outputting an integrator-signal. Preferably the integral-unit 4 operates with a moving window integration method, and the moving window comprises the predefined interval of consecutive values of the current measurement signal. According an especially preferred embodiment the integral-unit 4 is embedded comprising a FIFO-memory or register. The integral-unit 4 is especially embodied as part of a micro-controller. Special embodiments of the integral-unit 4 are described later on.

The detector 1 comprises a comparator unit 5 or trip unit, which is adapted to compare a value of the integrator-signal with a threshold level. In case the value of the integrator-signal reaches the threshold level the comparator unit 5 outputs a trigger signal.

If the overcurrent detector 1 is part of a circuit breaker 11 the comparator unit 5 is connected to an actuator 9. The trigger signal would cause the actuator 9 to operate the latching mechanism 8 to open the contacts 10. In case of a hybrid or solid state circuit breaker equivalent actions to switch off the electric line 2 will be caused by the trigger signal.

The threshold level respective the value of the threshold value is set by the threshold level determination unit 6 which is part of the overcurrent detector 1. An input of the threshold level determination unit 6 is connected to the sensor 3 or the ADC 12 to receive actual current measurement signals. An output of the threshold value determination unit 6 is connected to the comparator unit 5 to provide the comparator unit 5 with the threshold level. The threshold level determination unit 6 is adapted to determine the threshold level in dependence on the value of the actual current measurement signal.

According the first preferred embodiment the threshold level determination unit 6 is adapted to set a high threshold level for a high actual current measurement signal. This setting enables the detector 1 to a high robustness against transient currents as well as a fast reaction time for detecting short currents.

According the second preferred embodiment the threshold level determination unit 6 is adapted to set the threshold level to a constant low value for most of the currents, regardless their exact value which exceeds the nominal protection current of the detector 1. Only currents within a special value-interval or greater a special value will be except. The low threshold level would be set for example for currents which lower than one and a half a nominal protection current of the detector 1. By excluding currents with a special behavior or a value within a special current value interval or greater a special value it is possible to prevent nuisance tripping caused by an operating overcurrent. Such an overcurrent may be caused for example by welding machines. This kind of periodic overcurrent is usually high enough to trigger an overcurrent detector 1 but the energy is low enough that the electric lines will not be damaged. Therefor it is not necessary to switch them off. Typically the excepted currents have an actual value exceeding the nominal protection current a predefined integer multiple of magnitudes, especially five and/or six and/or seven and/or eight times the nominal protection current of the detector 1. The threshold level is set to a value higher the predefined number of magnitudes for such current measurement signals.

The overcurrent detector 1 can be used with a fixed length of the integration window. As the length of the integration window has an influence regarding the time behavior or the tripping time of the overcurrent detector, a flexible length of the integration window would be advantageous.

According the third preferred embodiment the detector 1 further comprises an integration window determination unit 7. An input of the integration window determination unit 7 is connected to the sensor 3 for receiving an actual current measurement signal. An output of the integration window determination unit 7 is connected to the integrator unit 4, proving the integrator unit 4 with the length of the integration window. The integration window determination unit 7 is adapted to determine the length of the integration window in dependence on the value of the actual current measurement signal.

According the forth preferred embodiment the integration window determination unit 7 is adapted to set a long integration window in case of a small value of the actual current measurement signal, and a short integration window in case of a high value of the actual current measurement signal. This corresponds to the behavior of a bimetal. Following this, it is further especially preferred that the integration window determination unit 7 is adapted to set the integration window greater than 2 ms in case of a value of the actual current measurement signal is lower than one and a half the nominal protection current of the detector 1, and a integration window shorter than 300 µs in case of a value of the actual current measurement signal higher than ten times the nominal protection current of the detector 1. These specific values caused good results in practice use.

According the fifth preferred embodiment the integration window determination unit 7 is adapted to set the integration window to a constant low value, especially lower than 500 µs, for all values of the actual measurement signal, except for current measurement signals with an actual value exceeding the nominal protection current a predefined whole number of magnitudes, especially five and/or six and/or seven and/or eight times the nominal protection current of the detector 1, and that the integration window is set to a high value, especially higher than 3 ms, for such current measurement signals. This embodiment combines a high robustness against high periodic operational currents and is sensitive for all other currents.

According a further preferred embodiment a combination of different described embodiments in suggested. Especially by using a microcontroller in the comparator unit 5 it is very easy to implement tripping characteristics according special demands.

The invention claimed is:

1. An overcurrent detector, the overcurrent detector comprising:
   a sensor configured to monitor an electric current in an electric line and to output a current measurement signal corresponding to the electric current;
   an integral-unit configured to integrate a predefined interval of consecutive values of the current measurement signal and to output an integrator signal;
   a comparator unit configured to compare a value of the integrator signal with a threshold level, and to output a trigger signal based upon the value of the integrator signal reaching the threshold level; and
   a threshold level determination unit configured to receive the current measurement signal, to determine the threshold level based on the value of the current measurement signal, and to output the threshold level to the comparator unit.

2. The overcurrent detector according to claim 1, wherein the threshold level determination unit is configured to set the threshold level to a high threshold level based on determining that the actual current measurement signal is a high signal.

3. The overcurrent detector according to claim 1, wherein the threshold level determination unit is configured to:
   set the threshold level to a constant low value, and
   modify the threshold level to a higher value for current measurement signals with an actual value exceeding a nominal protection current a predefined whole number of magnitudes.

4. The overcurrent detector according to claim 3, wherein the constant low value of the threshold level is lower than one and a half of a nominal protection current of the overcurrent detector.

5. The overcurrent detector according to claim 4, wherein the predefined whole number of magnitudes is five, six, seven, eight times the nominal protection of the overcurrent detector.

6. The overcurrent detector according to claim 1, wherein the integral-unit operates with a moving window integration method, and that a moving window of the moving window integration method comprises the predefined interval of consecutive values of the current measurement signal.

7. The overcurrent detector according to claim 6, wherein the overcurrent detector further comprises:
an integration window determination unit, with an input of the integration window determination unit being connected to the sensor for receiving the actual current measurement signal, and with an output of the integration window determination unit being connected to the integral unit, wherein the integration window determination unit provides the integral-unit with a length of the integration window, and wherein the integration window determination unit is configured to determine the length of the integration window based on the value of the actual current measurement signal.

8. The overcurrent detector according to claim 7, wherein the integration window determination unit is configured to:
set the length of the integration window to a long integration window in case of a small value of the actual current measurement signal, and
set the length of the integration window to a short integration window in case of a high value of the actual current measurement signal.

9. The overcurrent detector according to claim 7, wherein the integration window determination unit is configured to:
set the length of the integration window greater than 2 ms in case of a value of the actual current measurement signal is lower than one and a half the nominal protection current of the overcurrent detector, and
set the length of the integration window shorter than 300 µs in case of a value of the actual current measurement signal higher than ten times the nominal protection current of the overcurrent detector.

10. The overcurrent detector according to claim 6, wherein the integration window determination unit is configured to:
set the length of the integration window to a constant low value in case of a value of the actual current measurement signal for all values of the actual measurement signal, and
modify the length of the integration window to a high value in case of a value of the actual current measurement signal exceeds the nominal protection current by a predefined whole number of magnitudes.

11. The overcurrent detector according to claim 10, wherein the constant low value of the length of the integration window is lower than 500 µs.

12. The overcurrent detector according to claim 11, wherein the high value of the length of the integration window is greater than 3 ms.

13. The overcurrent detector according to claim 12, wherein the predefined whole number of magnitudes is five, six, seven, eight times the nominal protection of the overcurrent detector.

14. An overcurrent protection switch comprising the overcurrent detector according to claim 1.

15. An overcurrent detector, the overcurrent detector comprising:
a current sensor configured to measure an electric current in an electric line and to output a current measurement signal corresponding to the measured electric current,
a microcontroller configured to:
determine a plurality of consecutive values of the current measurement signal over time, the plurality of consecutive values comprising a present value of the current measurement signal at a present time;
integrate a predefined interval of the consecutive values of the current measurement signal to generate an integrator signal;
determine a threshold level based on the present value of the current measurement signal; and
output a trigger signal in a condition where a value of the integrator signal meets or exceeds the threshold level.

* * * * *